(12) United States Patent
Shamoto et al.

(10) Patent No.: US 9,837,264 B2
(45) Date of Patent: Dec. 5, 2017

(54) NONVOLATILE SEMICONDUCTOR MEMORY DEVICE AND METHOD OF MANUFACTURING THE SAME

(71) Applicant: Toshiba Memory Corporation, Minato-ku (JP)

(72) Inventors: Reiko Shamoto, Nagoya (JP); Hideto Takekida, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/074,033

(22) Filed: Mar. 18, 2016

(65) Prior Publication Data

US 2017/0018558 A1    Jan. 19, 2017

Related U.S. Application Data

(60) Provisional application No. 62/193,429, filed on Jul. 16, 2015.

(51) Int. Cl.

| H01L 29/788 | (2006.01) |
| H01L 21/02 | (2006.01) |
| H01L 27/11524 | (2017.01) |
| H01L 27/11536 | (2017.01) |
| H01L 27/11539 | (2017.01) |
| H01L 27/11541 | (2017.01) |
| H01L 27/11543 | (2017.01) |

(52) U.S. Cl.
CPC ...... *H01L 21/0223* (2013.01); *H01L 21/0217* (2013.01); *H01L 21/02123* (2013.01); *H01L 21/02164* (2013.01); *H01L 27/11524* (2013.01); *H01L 27/11536* (2013.01); *H01L 27/11539* (2013.01); *H01L 27/11541* (2013.01); *H01L 27/11543* (2013.01); *H01L 21/02255* (2013.01)

(58) Field of Classification Search
CPC ......... H01L 27/11521; H01L 27/11524; H01L 27/11541; H01L 27/11543
See application file for complete search history.

(56) References Cited

U.S. PATENT DOCUMENTS

| 6,369,423 | B2 | 4/2002 | Ohiwa et al. | |
| 6,432,795 | B1* | 8/2002 | Lee | H01L 28/91 257/E21.013 |
| 8,981,522 | B2 | 3/2015 | Fujii et al. | |
| 2006/0243978 | A1 | 11/2006 | Wakamiya et al. | |
| 2008/0197394 | A1* | 8/2008 | Caspary | H01L 21/3086 257/296 |
| 2014/0197473 | A1* | 7/2014 | Fujii | H01L 21/76224 257/324 |

FOREIGN PATENT DOCUMENTS

| JP | 2006-310601 | 11/2006 |
| JP | 4468187 | 5/2010 |
| JP | 2014-138101 | 7/2014 |

* cited by examiner

*Primary Examiner* — Marc Armand
*Assistant Examiner* — Sarah Salerno
(74) *Attorney, Agent, or Firm* — Oblon, McClelland, Maier & Neustadt, L.L.P.

(57) ABSTRACT

A nonvolatile semiconductor memory device comprises: a substrate; a memory cell that is disposed on the substrate and accumulates a charge as data; and a cover layer covering the memory cell. The cover layer has a structure in which a first silicon nitride layer, an intermediate layer, and a second silicon nitride layer are stacked sequentially from a memory cell side.

5 Claims, 16 Drawing Sheets

NONVOLATILE SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/193,429, filed on Jul. 16, 2015, the entire contents of which are incorporated herein by reference.

FIELD

Embodiments described herein generally relate to a nonvolatile semiconductor memory device and a method of manufacturing the same.

BACKGROUND

In the field of nonvolatile semiconductor memory devices having memory cells disposed two-dimensionally on a substrate, such as NAND type flash memories, good cell characteristics must be maintained, and in order to do so, a current flowing in the memory cells or substrate must be secured at a certain level or more.

DETAILED DESCRIPTION

Figure 1:
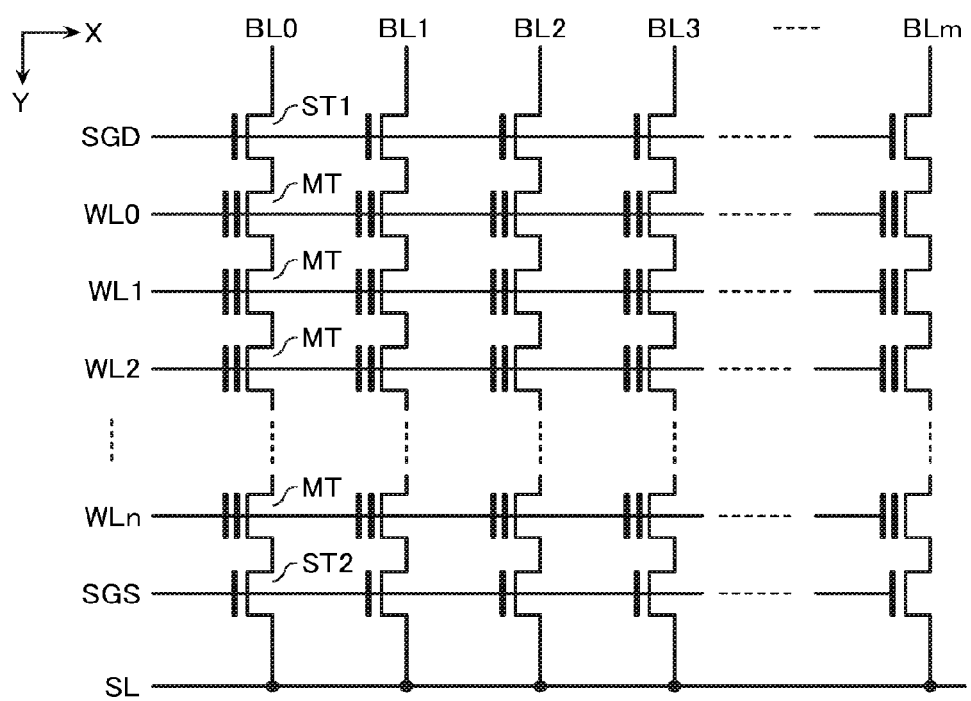
FIG. 1 shows an example of a circuit diagram showing a schematic configuration of a memory block included in a semiconductor memory device according to an embodiment.

A nonvolatile semiconductor memory device according to an embodiment described below comprises: a substrate; a memory cell that is disposed on the substrate and accumulates a charge as data; and a cover layer covering the memory cell. The cover layer has a structure in which a first silicon nitride layer, an intermediate layer, and a second silicon nitride layer are stacked sequentially from a memory cell side.

Next, nonvolatile semiconductor memory devices according to embodiments will be described in detail with reference to the drawings. Note that these embodiments are merely examples. Moreover, each of the drawings of the nonvolatile semiconductor memory devices employed in the embodiments below is schematic, and thicknesses, widths, ratios, and so on, of layers are not limited to those described in the drawings.

Moreover, a memory cell described below has a so-called flat cell structure. However, this is merely an example, and technology of these embodiments may be applied also to a so-called rocket cell structure. Moreover, the technology may be applied also to a NOR type memory cell as well as to a NAND type memory cell.

[Configuration of Nonvolatile Semiconductor Memory Device]

FIG. 1 is an example of a circuit diagram showing a schematic configuration of one memory block included in a NAND type flash memory according to an embodiment. The memory block of the flash memory comprises (m+1) NAND strings disposed sequentially along an X direction (m is a natural number). Each NAND string comprises: select transistors ST1 and ST2; and (n+1) memory cell transistors MT (n is a natural number). The select transistors ST1 respectively included in the (m+1) NAND strings have their drains connected bit line BL0 to BLm, and each have their control gate electrodes commonly connected to a select gate line SGD. Moreover, the select transistors ST2 have their sources commonly connected to a source line SL, and each have their gate electrodes commonly connected to a select gate line SGS.

In each NAND string, the (n+1) memory cell transistors MT are disposed so as to be connected in series between a source of the select transistor ST1 and a drain of the select transistor ST2.

Word lines WL0 to WLn commonly connect the control gate electrodes of the memory cell transistors MT, among the NAND strings in one memory block. In other words, the control gate electrodes of the memory cell transistors MT in an identical row in one memory block are connected to an identical word line WL. The (m+1) memory cell transistors MT connected to this identical word line WL are treated as one page, and write of data and read of data are performed on the basis of this page.

Moreover, the bit lines BL0 to BLm commonly connect the drains of the select transistors ST1, among the memory blocks. In other words, the memory cell transistors MT of the NAND strings in an identical column over a plurality of the memory blocks are connected to an identical bit line BL.

Figure 2:
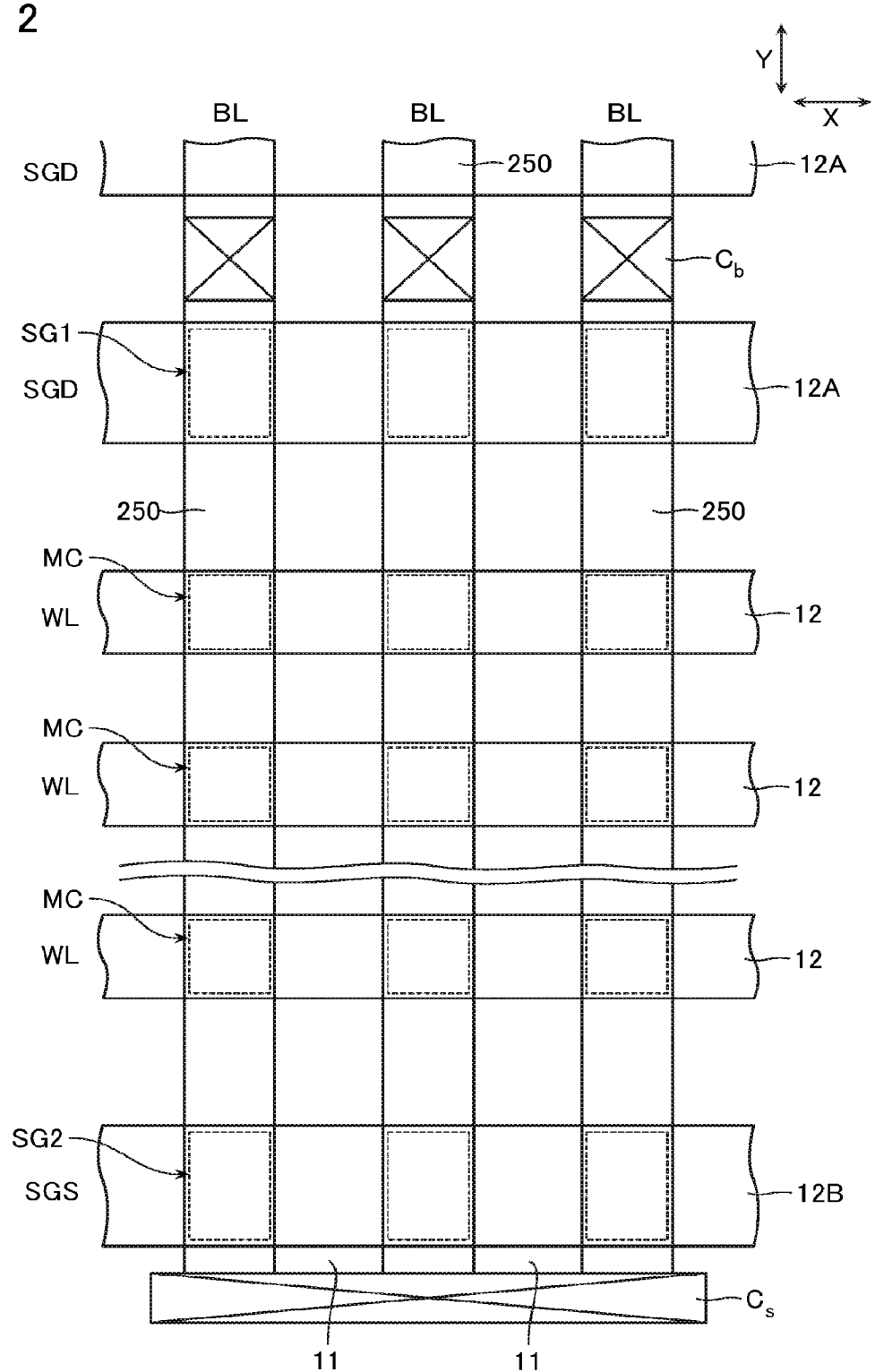
FIG. 2 shows an example of a schematic configuration of a memory cell array of a nonvolatile semiconductor memory device according to an embodiment.

FIG. 2 shows an example of a schematic configuration of a memory cell array of a nonvolatile semiconductor memory device according to an embodiment. Word lines (WL) 12 and bit lines (BL) 250 are arranged intersecting each other, and a memory cell MC is formed at each of intersections of the word lines 12 and bit lines 250.

The plurality of memory cells MC aligned in a bit line BL direction are connected in series by sharing source/drain diffusion regions between the memory cells MC. The series-connected plurality of memory cells MC configure one memory string. One end of the memory string is connected to the bit line BL via a drain side select gate transistor SG1. The bit line BL and the drain side select gate transistor SG1 are connected via a contact $C_b$.

In addition, the other end of the memory string is connected to an unillustrated source line SL, via a source side select gate transistor SG2. The source line SL and the source side select gate transistor SG2 are connected via a source side contact $C_s$.

A gate of the drain side select gate transistor SG1 is connected to a drain side select gate line (SGD) 12A arranged parallel to the word line WL. Moreover, a gate of the source side select gate transistor SG2 is connected to a source side select gate line (SGS) 12B arranged parallel to the word line WL. Now, a direction in which the word line WL extends is defined as a word line direction (X direction), and a direction in which the bit line BL extends is defined as a bit line direction (Y direction).

Moreover, an element isolation insulating film 11 that extends having the Y direction as its longer direction is formed with a certain spacing in the X direction on a surface of a substrate 10 where the memory cell MC is disposed. The element isolation insulating film is formed from, for example, silicon oxide ($SiO_2$). A region of the substrate 10 sandwiched by the element isolation insulating films 11 is an active area AA where the memory string (memory cell) is formed. That is, the surface of the substrate 10 is electrically isolated into a plurality of the active areas AA by the element isolation insulating film 11. The active areas AA, similarly to the element isolation insulating films 11, extend having the Y direction as their longer direction and are formed with a certain spacing in the X direction.

Moreover, although illustration thereof is omitted, a peripheral region of the memory cell array shown in FIG. 2 has disposed therein a contact for achieving electrical connection with a peripheral transistor or a peripheral circuit, and various kinds of wiring lines.

First Embodiment

Figure 3:
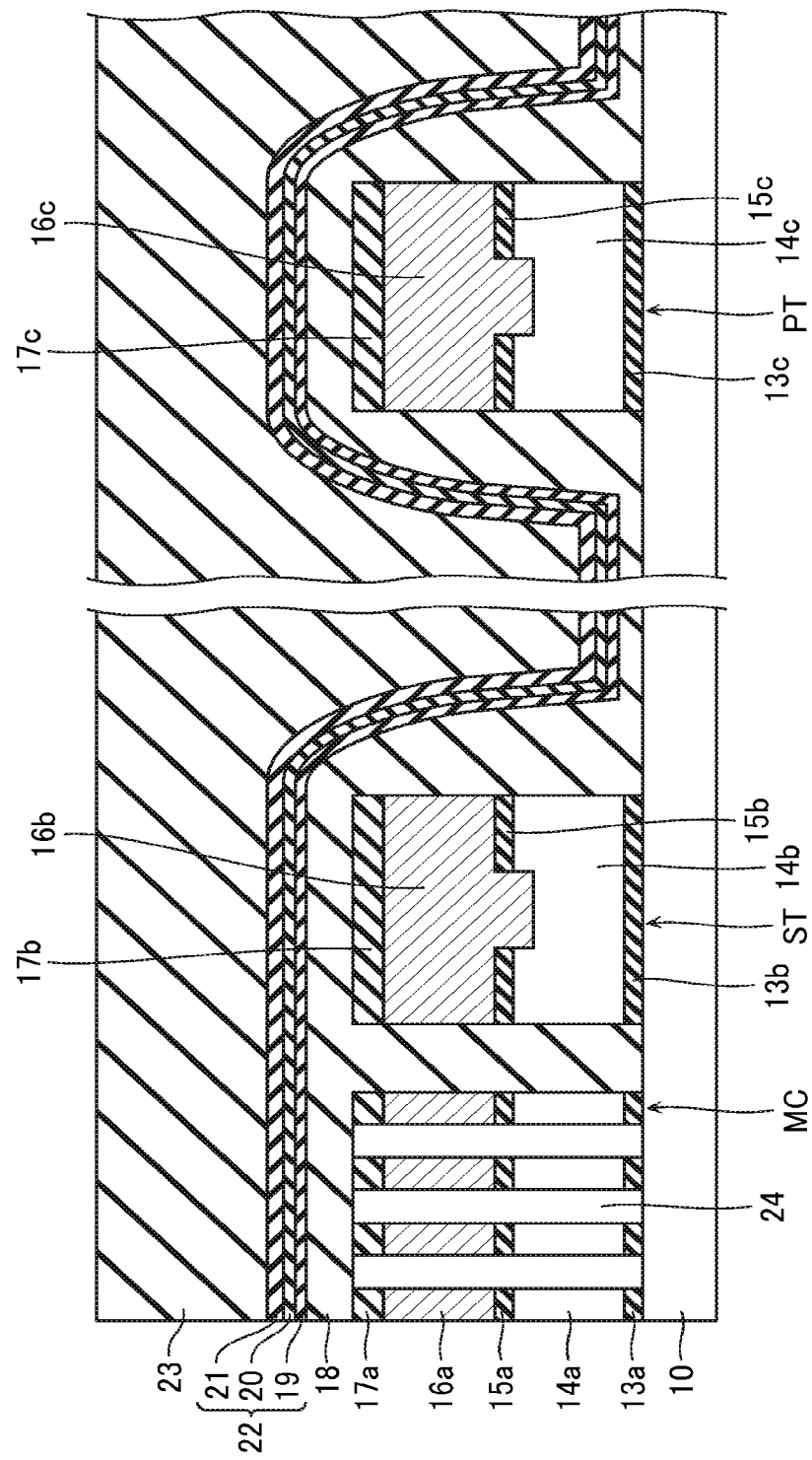
FIG. 3 is a partial cross-sectional view showing an example of a configuration of a nonvolatile semiconductor memory device according to a first embodiment.

Next, a nonvolatile semiconductor memory device according to a first embodiment will be described in detail.
[Configuration of Nonvolatile Semiconductor Memory Device According to First Embodiment]
FIG. 3 is a cross-sectional view showing an example of a configuration of a portion including a memory cell MC, a select transistor ST, and a peripheral transistor PT, of the nonvolatile semiconductor memory device according to the first embodiment.

The plurality of memory cells MC, the select transistor ST, and the peripheral transistor PT shown in FIG. 3 are disposed on a substrate 10 configured from the likes of silicon. Note that the memory cell MC, the select transistor ST, and the peripheral transistor PT in the present embodiment have similar structures, hence the description below will focus on the memory cell MC.

As shown in FIG. 3, the memory cells MC each comprise: a gate insulating film 13a (tunnel insulating film) disposed on a channel region of the substrate 10; and a floating gate electrode 14a configured from polysilicon, for example, and disposed on the gate insulating film 13a. A film thickness of the gate insulating film 13a may be set to about 6 nm, for example. A film thickness of the floating gate electrode 14a may be set to about 10 to 25 nm, for example. Moreover, in the present embodiment, the floating gate electrode 14a has a single-layer structure, but a stacked structure combining a plurality of materials may also be adopted. In the case of adopting a stacked structure, it is also possible for a metal layer to be adopted as one of elements configuring the stacked structure.

Note that although not illustrated in the present embodiment, a charge accumulation film may also be disposed on the floating gate electrode 14a. The charge accumulation film has a function of accumulating a charge injected into the floating gate electrode 14a via the gate insulating film 13a by a write operation, and is formed by, for example, silicon nitride (SiN). A film thickness of the charge accumulation film may be set to about 2 nm, for example. Presence of the charge accumulation film makes it possible for an aspect ratio of the floating gate electrode 14a to be reduced.

Accumulating a charge in the floating gate electrode 14a (additionally in the charge accumulation layer when a charge accumulation layer is disposed) makes it possible for the memory cell MC to nonvolatilely accumulate this charge as data.

Moreover, a block insulating film 15a configured from silicon oxide, for example, is disposed above the floating gate electrode 14a (on the charge accumulation film when a charge accumulation film is formed).

Note that the block insulating film 15a has a single-layer structure in the illustrated example, but is not limited to this, and the block insulating film 15a may also be configured as a stacked structure formed by a plurality of materials. In the case of being configured as a stacked structure, it is possible to adopt a configuration in which, for example, a first layer configured from hafnium oxide (HfOx), a second layer configured from silicon oxide ($SiO_2$), and a third layer configured from hafnium oxide (HfOx), are stacked. In this case, thicknesses of these layers may each be set to about 5 nm, for example.

Note that also employable as materials of the gate insulating film 13a (tunnel insulating film) and the block insulating film 15a, besides silicon oxide (SiOx), are, for example, $Al_2O_3$, $Y_2O_3$, $La_2O_3Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on.

Moreover, the block insulating film 15a has the following disposed thereon, namely: a conductive layer 16a which is an electrode functioning as a control gate; and a cap layer 17a disposed on an upper portion of the conductive layer 16a. The conductive layer 16a may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or by a compound of these, but may also be formed by polysilicon to which an impurity has been added.

The cap layer 17a is configured from, for example, silicon oxide or silicon nitride. This cap layer plays a role of suppressing the conductive layer 16a getting shaved during etching in a later step.

In addition, a gap 24 is formed between the memory cells MC.

The select transistor ST also has a configuration in which an insulating layer 13b through cap layer 17b are stacked, similarly to the memory cell MC. The peripheral transistor PT also similarly has a configuration in which an insulating layer 13c through cap layer 17c are stacked.

A first inter-layer insulating layer 18 is disposed so as to cover the memory cell MC, the select transistor ST, and the peripheral transistor PT. The first inter-layer insulating layer 18 in the present embodiment is formed from, for example, silicon oxide.

Moreover, in the present embodiment, a cover layer 22 is provided in a layer above the first inter-layer insulating layer 18. That is, the cover layer 22 covers the memory cell MC, the select transistor ST, and the peripheral transistor PT. Moreover, the cover layer 22 is curved toward a substrate 10 direction, so as to face part of a side surface of the select transistor ST, in a portion shifting from a region where the memory cell MC and the select transistor ST are formed (memory cell array region) to a peripheral region.

This cover layer 22 has a structure in which a first silicon nitride layer 19, a silicon oxide layer 20 (intermediate layer), and a second silicon nitride layer 21 are stacked sequentially from a memory cell MC side.

As will be described below, this cover layer 22 plays a role as a stopper layer of etching when a contact, and so on, are formed in a later step.

In a planar type memory device such as the above-described kind of NAND type flash memory, contact holes of a variety of patterns, such as a via contact that connects a drain of a memory cell portion and the bit line BL, a linear contact for acquiring a voltage one time on a source side, a contact for connecting and supplying a voltage to a source, a drain, and a gate of a peripheral region portion where the likes of a peripheral transistor are disposed, are formed. However, along with miniaturization of the memory cell portion, a difference in contact diameter between the memory cell portion and the peripheral region portion is increasing, and it is becoming difficult to acquire a margin during etching. In other words, conditions of etching differ according to a diameter difference of the contact holes, and if it is attempted to forma plurality of contacts simultaneously, some of the contact holes end up reaching the substrate before other contact holes. Then, a surface of the substrate 10 between the memory cells MC sometimes ends up falling below an original surface of the substrate 10 (a surface of the substrate 10 below the memory cell MC). In such a case, a path of a cell current flowing between the memory cells MC ends up lengthening, hence a potential difference lowers and cell characteristics consequently end up deteriorating.

In order to prevent such rutting of the substrate, the cover layer 22 disposed on the first inter-layer insulating layer 18 configured from silicon oxide adopts a configuration of one silicon oxide layer sandwiched by two silicon nitride layers.

The silicon nitride included in the cover layer 22 has an etching rate that differs from that of the silicon oxide configuring the first inter-layer insulating layer 18, hence functions as a stopper layer during etching, and cancels a difference of etching rates due to a contact pattern. Moreover, by having subsequent etching implemented separately, rutting of the substrate caused by a pattern difference of the contacts is suppressed.

For the silicon nitride layer to be employed as a stopper material during etching, a film thickness of about 30 nm, for example, must be secured.

However, there is a problem that if the silicon nitride layer is deposited thickly in one go, then impurity implantation during a later step of a diffusion layer formation step becomes difficult. Accordingly, in the present embodiment, the cover layer 22 is configured as a three-layer structure of the comparatively thin first silicon nitride layer 19 and silicon oxide layer 20, and the comparatively thick second silicon nitride layer 21.

This configuration makes possible a step in which diffusion layer implantation is performed after deposition of the comparatively thin first silicon nitride layer 19, and then the comparatively thick second silicon nitride layer 21 is deposited. As a result, a thickness of the silicon nitride layer overall (a thickness combining the first silicon nitride layer 19 and the second silicon nitride layer 21) in proportions required in execution of implantation for diffusion layer formation and in an etching stopper, can be secured.

Moreover, depositing the first silicon nitride layer 19 and the second silicon nitride layer 21 divided as in the present embodiment also plays the role of suppressing a cleaning solution penetrating to an electrode material of tungsten (W) or the like configuring the control gate electrode 17a due to forming and peeling of a resist during implantation execution and the tungsten getting abnormally oxidized by a later heat step.

Meanwhile, as will be mentioned later, the silicon oxide layer 20 in the present embodiment is formed by depositing the first silicon nitride layer 19 and then heat-treatment oxidizing a surface of the first silicon nitride layer 19. Due to this configuration, the following advantages may also be expected. That is, silicon nitride employs silane ($SiH_4$) during a manufacturing process, hence includes much hydrogen. Therefore, if a film of the silicon nitride is thick, much active hydrogen is generated in a heat step after silicon nitride deposition, and a hydrogen concentration in the tunnel insulating film increases whereby electron traps end up increasing. If electron traps increase, there is a risk that electrons moving within the memory cell MC end up getting trapped in the tunnel insulating film, degradation of cell current is caused, and cell reliability deteriorates.

However, by oxidizing the surface of the first silicon nitride layer 19 to configure the silicon oxide layer 20 as in the present embodiment, first, a thickness occupied by the silicon nitride layer in the cover layer 22 overall decreases. This means that silicon nitride which is a generation source of hydrogen decreases, hence electron traps resulting from hydrogen can be suppressed, and deterioration of cell characteristics can be prevented.

Moreover, when the surface of the first silicon nitride layer 19 is heat-treatment oxidized, an impurity such as hydrogen present in the first silicon nitride layer 19 is emitted to outside of the first silicon nitride layer 19 by this heat treatment. As a result, the first silicon nitride layer 19 becomes a finer film whereby film quality improves. As a result, hydrogen emission from this first silicon nitride layer 19 can be suppressed, and deterioration of cell characteristics can be prevented similarly to as described above.

Moreover, the silicon oxide layer 20 interposed between the first silicon nitride layer 19 and the second silicon nitride layer 21 functions as a barrier layer to an impurity emitted from the second silicon nitride layer 21 or a layer formed in a higher layer than the cover layer 22 in a later step, thereby enabling impurity diffusion to the memory cell portion to be more reliably suppressed.

Furthermore, the cover layer 22 in the present embodiment, as well as covering upper portions of the memory cell MC and the select transistor ST, is curved toward a substrate 10 direction in a region more outward than the select transistor. In other words, the cover layer is disposed so as to face part of the side surface of the select transistor ST.

By configuring in this way, the cover layer 22 functions as a barrier layer during etching in the region more outward than the select transistor ST, and moreover it also becomes possible to prevent penetration of an impurity such as hydrogen generated outward of the select transistor ST. The peripheral transistor PT also has a similar configuration.

The first silicon nitride layer 19 according to the present embodiment preferably has a thickness after its surface has been heat-treated of about 2 to 3 nm, for example. The silicon oxide layer 20 formed by heat-treatment oxidizing the surface of the first silicon nitride layer 19 preferably has a thickness of about 2 to 3 nm, for example. Moreover, the second silicon nitride layer 21 preferably has a thickness of about 25 nm, for example.

The thicknesses of each of the layers of the cover layer 22 in the present embodiment are not limited to those of the above-described example. For example, it is only required that at least the first silicon nitride layer 19 is thin enough not to be an obstacle during implantation when a diffusion layer is formed, the second silicon nitride layer 21 is thicker than the first silicon nitride layer 19, and a thickness of the silicon nitride layer combining the first and second silicon nitride layers is thick enough to function as an etching stopper.

Note that if the first silicon nitride layer 19 which is a lowermost layer of the cover layer 22 directly contacts the substrate 10 configured from silicon, electrons flowing in the substrate 10 get trapped by electron traps in the silicon nitride configuring the first silicon nitride layer 19. The trapped electrons end up exerting a depleting action on the substrate 10, hence electrical characteristics deteriorate. Accordingly, the cover layer 22 is disposed on the first inter-layer insulating layer 18 configured from silicon oxide provided on the substrate 10, such that the first silicon nitride layer 19 and the substrate 10 do not directly contact each other.

Moreover, a periphery of the memory cell MC and select transistor ST and a periphery of the peripheral transistor PT have the various kinds of contacts or wiring lines of the above-described kind formed therein, but illustration thereof is omitted in the present embodiment.

[Method of Manufacturing Nonvolatile Semiconductor Memory Device According to First Embodiment]

A method of manufacturing the nonvolatile semiconductor memory device according to the first embodiment will be described with reference to FIGS. 4 to 8.

Note that in the present embodiment, the memory cell MC, the select transistor ST, and the peripheral transistor PT are formed simultaneously, and have an identical stacked structure. Therefore, for simplification of explanation, description will be made below with reference to reference symbols assigned to the memory cell MC.

Figure 4:
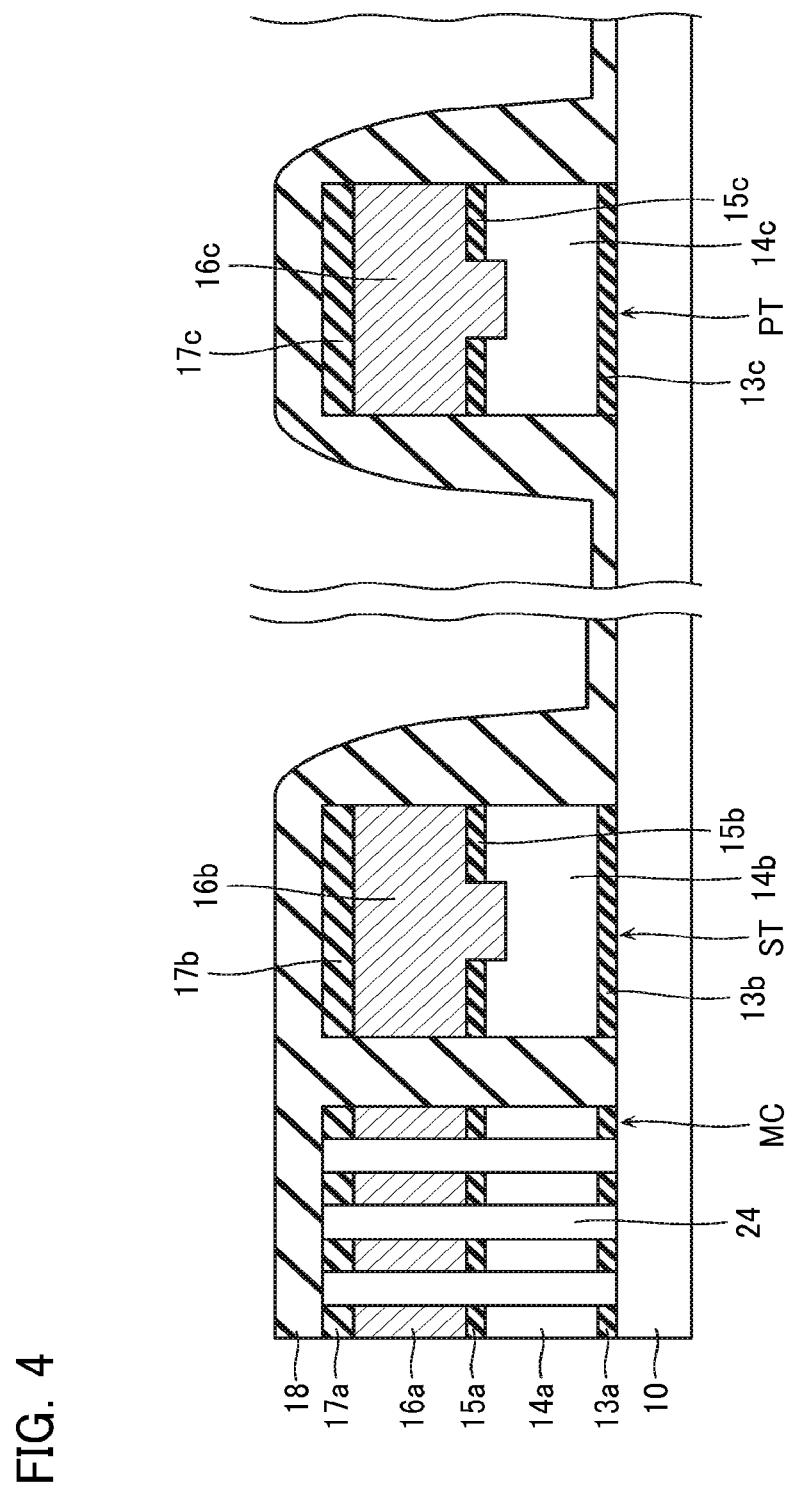
FIG. 4 is a process drawing showing a method of manufacturing the nonvolatile semiconductor memory device of the first embodiment.

As shown in FIG. 4, the gate insulating film 13a configured from the likes of a silicon oxide film is formed on the substrate 10 configured from the likes of silicon. The floating gate electrode 14a configured from the likes of polysilicon is formed on the gate insulating film 13a. The block insulating film 15a configured from a single-layer silicon oxide film is formed on the floating gate electrode 14a. Moreover, the conductive layer 16a configured from tungsten and the cap layer 17a configured from a silicon oxide film or silicon nitride film are formed on the block insulating film 15a.

Moreover, the first inter-layer insulating layer 18 acting as a spacer securing a space at an upper portion of the memory cell MC is formed by the likes of CVD of silicon oxide. This first inter-layer insulating layer 18 plays a role of preventing the first silicon nitride layer 19 in the cover layer 22 and the substrate 10 from directly contacting each other as mentioned above.

Note that in the present embodiment, the gap 24 is formed between the plurality of memory cells MC. However, by for example changing deposition conditions of the silicon oxide configuring the first inter-layer insulating layer 18, it is also possible to configure such that the gap 24 is filled by the first inter-layer insulating layer 18.

Figure 5:
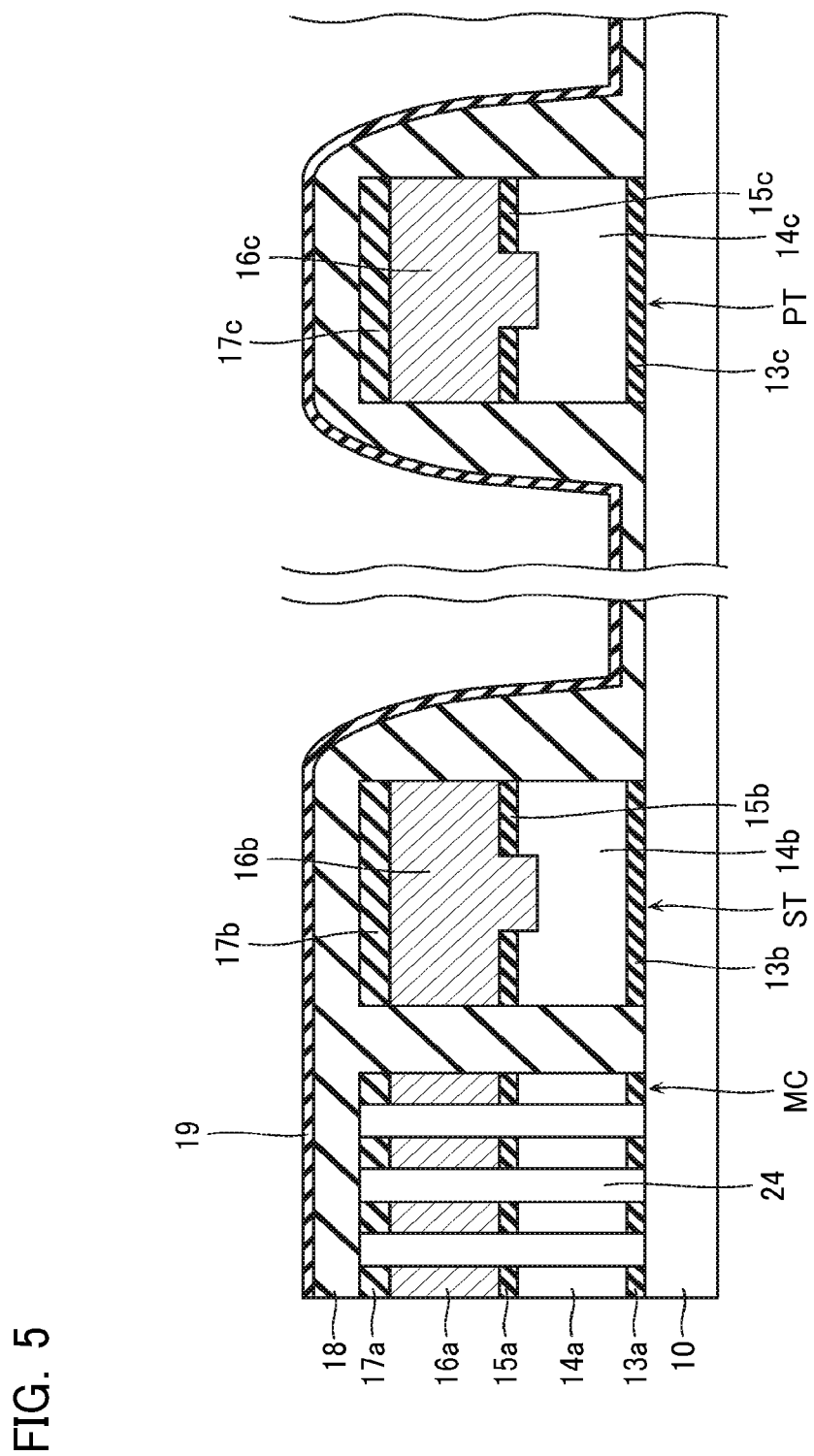
FIG. 5 is a process drawing showing the method of manufacturing the nonvolatile semiconductor memory device of the first embodiment.

As shown in FIG. 5, the first silicon nitride layer 19 is deposited on the first inter-layer insulating layer 18. Examples of methods for this deposition are a so-called PVD method such as sputtering or a CVD method employing a gas. In the case of depositing by the PVD method, the likes of a gas including another element is not included in a raw material, hence an impurity is never mixed in. However, step coverage in deposition by the PVD method is low, hence when there is a step in a deposition target region as in the present embodiment, it is difficult for deposition to be performed uniformly on an entire region.

On the other hand, the CVD method excels in step coverage. Therefore, in the present embodiment, the first silicon nitride layer 19 is deposited by the likes of a plasma CVD method having as its raw materials, for example, silane ($SiH_4$) and ammonia or nitrogen.

The thickness of the first silicon nitride layer 19 is formed with a thickness such as not to be an obstacle during implantation of an impurity as mentioned above. Specifically, the thickness is about 5 nm, for example.

Figure 6:
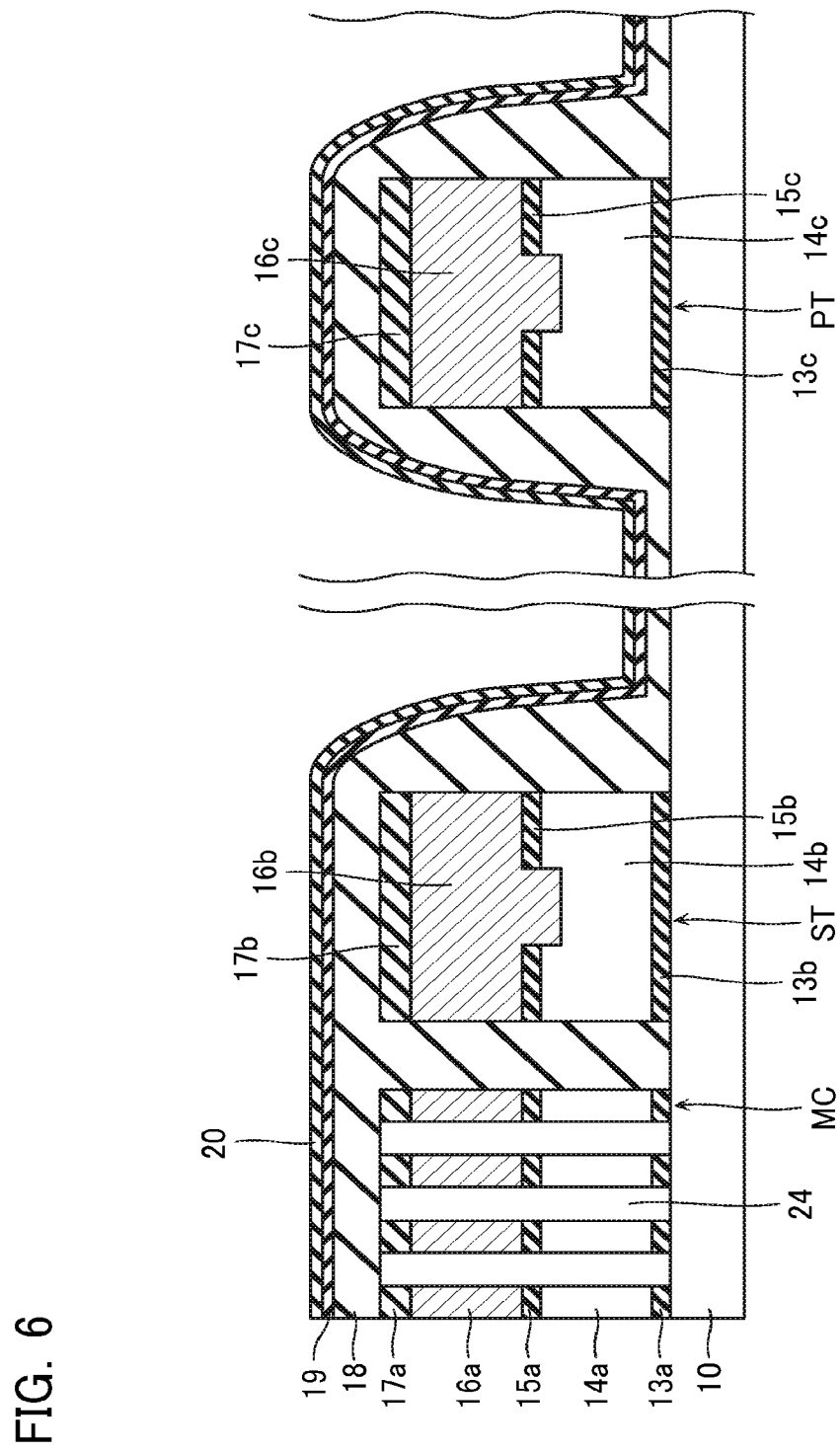
FIG. 6 is a process drawing showing the method of manufacturing the nonvolatile semiconductor memory device of the first embodiment.

As shown in FIG. 6, heat treatment is performed on the surface of the first silicon nitride layer 19, and the surface of the first silicon nitride layer 19 is oxidized to configure the silicon oxide layer 20 having a thickness of about 2 to 3 nm. At this time, plasma oxidation with a temperature set to 800° C. to 900° C., for example, is employed. The plasma oxidation makes it possible for only close to a surface of a treatment target to be oxidized, hence the first silicon nitride layer 19 is never completely oxidized.

Moreover, treating at a high temperature as described above makes it possible for hydrogen included in the first silicon nitride layer 19 to be emitted to outside, and for the first silicon nitride layer 19 to be configured as a fine film having few impurities.

In addition, impurities such as phosphorus (P) or boron (B) are implanted between the memory cells MC and between the memory cell MC and the select transistor ST of the surface of the substrate 10, and an unillustrated diffusion layer is formed.

Formation of the diffusion layer need only be after deposition of the first silicon nitride layer 19 and before deposition of the second silicon nitride layer 21. In other words, formation of the diffusion layer may be either before or after a step of performing heat treatment on the surface of the first silicon nitride layer 19 to form the silicon oxide layer 20. However, sometimes, in the case that a concentration of impurity implanted is high, damage caused to a film on the substrate 10 increases, hence in such a case, formation of the diffusion layer is preferably performed before film formation of the silicon oxide layer 20.

Figure 7:
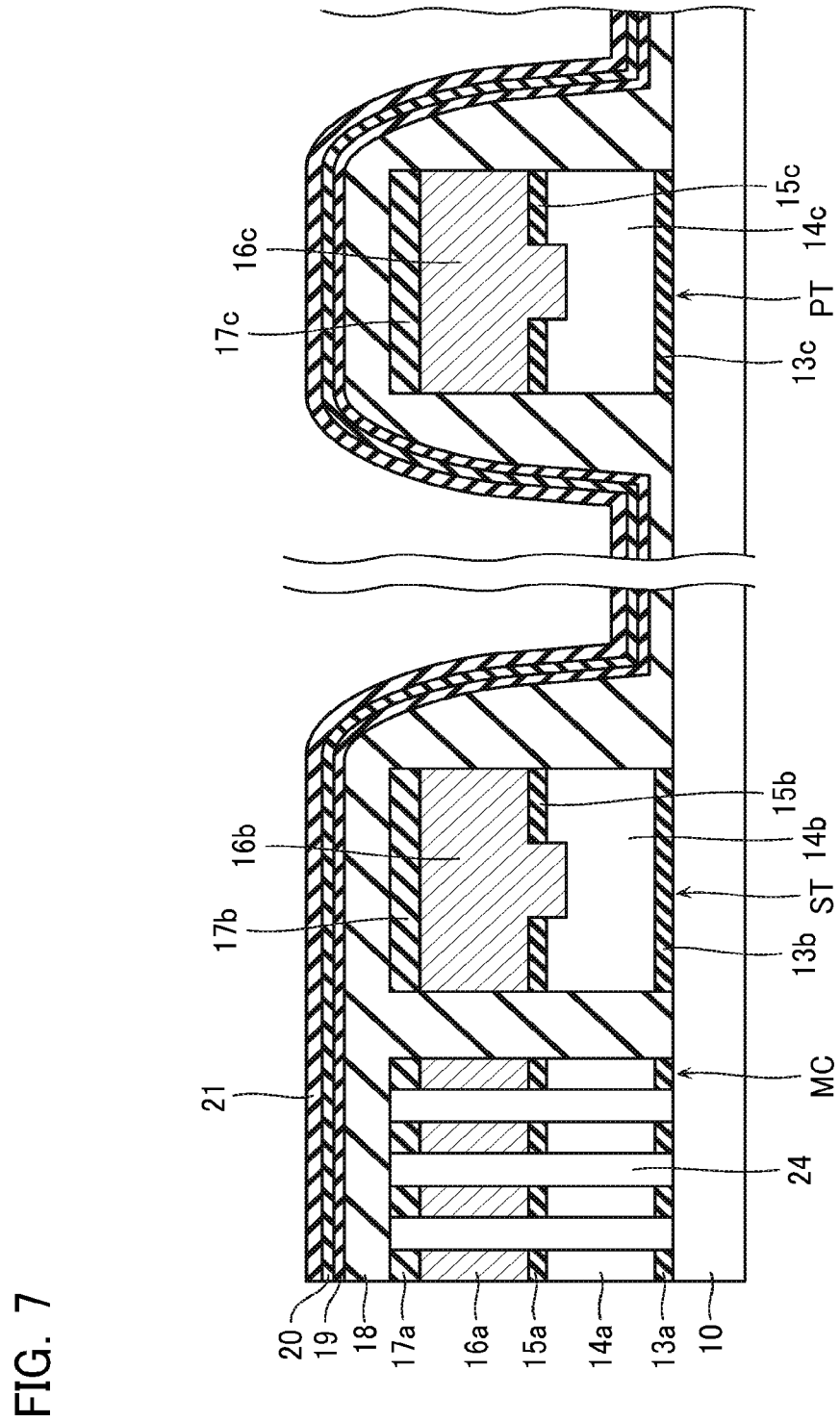
FIG. 7 is a process drawing showing the method of manufacturing the nonvolatile semiconductor memory device of the first embodiment.

As shown in FIG. 7, the second silicon nitride layer 21 is deposited on the silicon oxide layer 20 in a similar way to the first silicon nitride layer 19. The thickness of the second silicon nitride layer 21 is secured to a sufficient degree that, combined with the first silicon nitride layer 19, the second nitride layer 21 functions as an etching stopper during formation of a contact hole in a later step. Specifically, the thickness is about 25 nm, for example.

In such a way, the cover layer 22 configured from a three-layer structure of the first silicon nitride layer 19, the silicon oxide layer 20, and the second silicon nitride layer 21, is obtained.

Then, the second inter-layer insulating layer 23 configured from silicon oxide is deposited on an upper surface of the cover layer 22, and a configuration of FIG. 3 is obtained.

Now, a configuration of the cover layer 22 of the present embodiment will be described compared to the case where the silicon oxide layer 20 is not formed.

Figure 8:
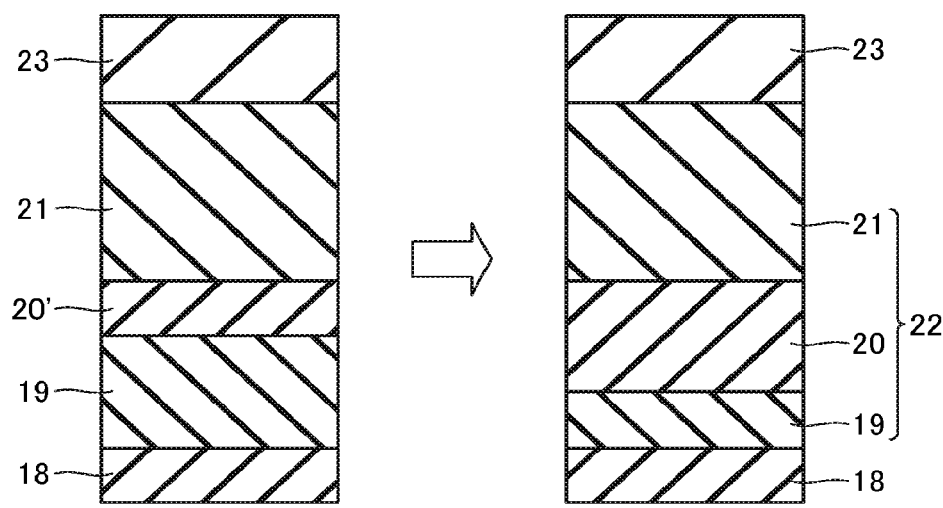
FIG. 8 is a schematic view for explaining a comparison of the cases where a surface of a first silicon nitride layer is not heat-treatment oxidized and where it is heat-treatment oxidized, in the nonvolatile semiconductor memory device of the first embodiment.

As shown on the left side of FIG. 8, in the case that after deposition of the first silicon nitride layer 19, the second silicon nitride layer 21 is deposited without heat-treatment oxidizing the surface of the first silicon nitride layer 19, a natural silicon oxide film 20' of negligible thickness is formed on the surface of the first silicon nitride layer 19.

On the other hand, as shown on the right side of FIG. 8, in the case that after deposition of the first silicon nitride layer 19, its surface is heat-treatment oxidized as in the present embodiment, the silicon oxide layer 20 is formed on the surface.

Comparing the two, when the surface of the first silicon nitride layer 19 is heat-treatment oxidized as in the present embodiment, an overall thickness of silicon nitride which is an emission source of hydrogen configuring the electron traps, decreases. Moreover, the thickness of the silicon oxide layer acting as an impurity stopper material increases, and penetration to the memory cell of impurities from the second silicon nitride layer 21 and a more upward portion than the cover layer 22, can be prevented. Furthermore, the first silicon nitride layer 19 is heat-treated at a high temperature, hence an impurity included in the first silicon nitride layer 19 itself is expelled, and the first silicon nitride layer 19 becoming an impurity emission source is suppressed. Moreover, total film thickness of the two is unchanged, hence a problem such as increased size of the device, and so on, never occurs either.

As described above, depositing the first silicon nitride layer 19 and the second silicon nitride layer 21 separately and heat-treating the surface of the first silicon nitride layer 19 after deposition of the first silicon nitride layer 19 to form the silicon oxide layer 20 as in the present embodiment is understood to enable impurity penetration to the memory cell to be significantly suppressed.

Second Embodiment

Next, a nonvolatile semiconductor memory device according to a second embodiment will be described using FIGS. 9 to 11. The nonvolatile semiconductor memory device according to the second embodiment has an overall configuration largely identical to that of the nonvolatile semiconductor memory device according to the first embodiment, said identical portions are assigned with the same reference symbols as those assigned in the first embodiment, and description of the identical portions will be omitted.

[Configuration of Nonvolatile Semiconductor Memory Device According to Second Embodiment]

Figure 9:
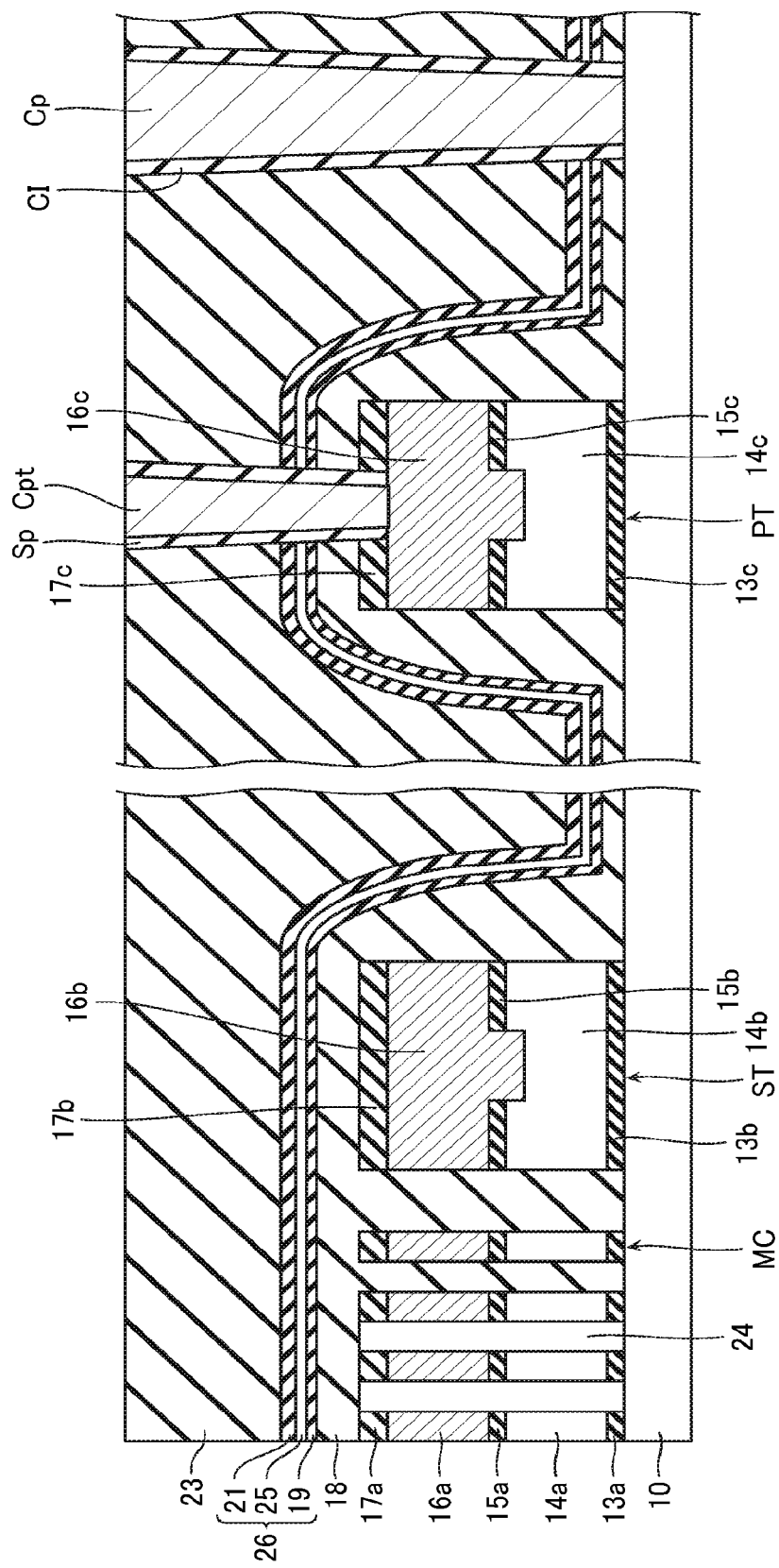
FIG. 9 is a partial cross-sectional view showing an example of a configuration of a nonvolatile semiconductor memory device of a second embodiment.

FIG. 9 shows an example of a configuration of the nonvolatile semiconductor memory device according to the second embodiment.

The nonvolatile semiconductor memory device according to the second embodiment differs from the nonvolatile semiconductor memory device according to the first embodiment in a material of a layer (intermediate layer) sandwiched between the first silicon nitride layer 19 and the second silicon nitride layer 21 and in that a cover layer 26 at an upper portion of the peripheral transistor PT is divided by a spacer $S_p$ covering a periphery of a peripheral transistor-dedicated contact $C_{pt}$.

In the second embodiment, the cover layer 26 in which an amorphous silicon layer 25 configured from amorphous silicon is disposed as an intermediate layer between the first silicon nitride layer 19 and the second silicon nitride layer 21, is disposed instead of the cover layer 22 configured from the first silicon nitride layer 19, the silicon oxide layer 20, and the second silicon nitride layer 21 in the first embodiment.

Amorphous silicon has superior hydrogen blocking characteristics to silicon oxide employed in the first embodiment. This is because a dangling bond possessed by amorphous silicon bonds with active hydrogen and suppresses diffusion of the active hydrogen. Therefore, employing the amorphous silicon layer 25 makes it possible to more reliably suppress hydrogen generated from the second silicon nitride layer 21 and a more upper portion than the cover layer 26 ending up penetrating into the memory cell.

However, contrary to silicon oxide, amorphous silicon has conductivity. Therefore, there is a risk that if, for example, the cover layer 26 gets electrically connected to the contact $C_p$ provided in a peripheral region of the peripheral transistor PT, cell characteristics end up deteriorating due to a leak current from the amorphous silicon layer 25, and so on.

Accordingly, when employing the amorphous silicon layer 25 as the intermediate layer as in the present embodiment, a periphery of the contact $C_{pt}$ for electrically connecting the likes of an upper portion wiring line to the peripheral transistor PT is covered by the spacer $S_p$ configured from an insulator of the likes of silicon oxide, for example, and the cover layer 26 is divided by this spacer $S_p$. Configuring in this way makes it possible to prevent cell characteristics from deteriorating by the leak current from the amorphous silicon layer 25.

[Method of Manufacturing Nonvolatile Semiconductor Memory Device According to Second Embodiment]

A method of manufacturing the nonvolatile semiconductor memory device according to the second embodiment will be described using FIGS. 10 and 11.

The method of manufacturing the nonvolatile semiconductor memory device according to the second embodiment is similar to the method of manufacturing the nonvolatile semiconductor memory device according to the first embodiment up to a state of FIG. 5.

Figure 10:
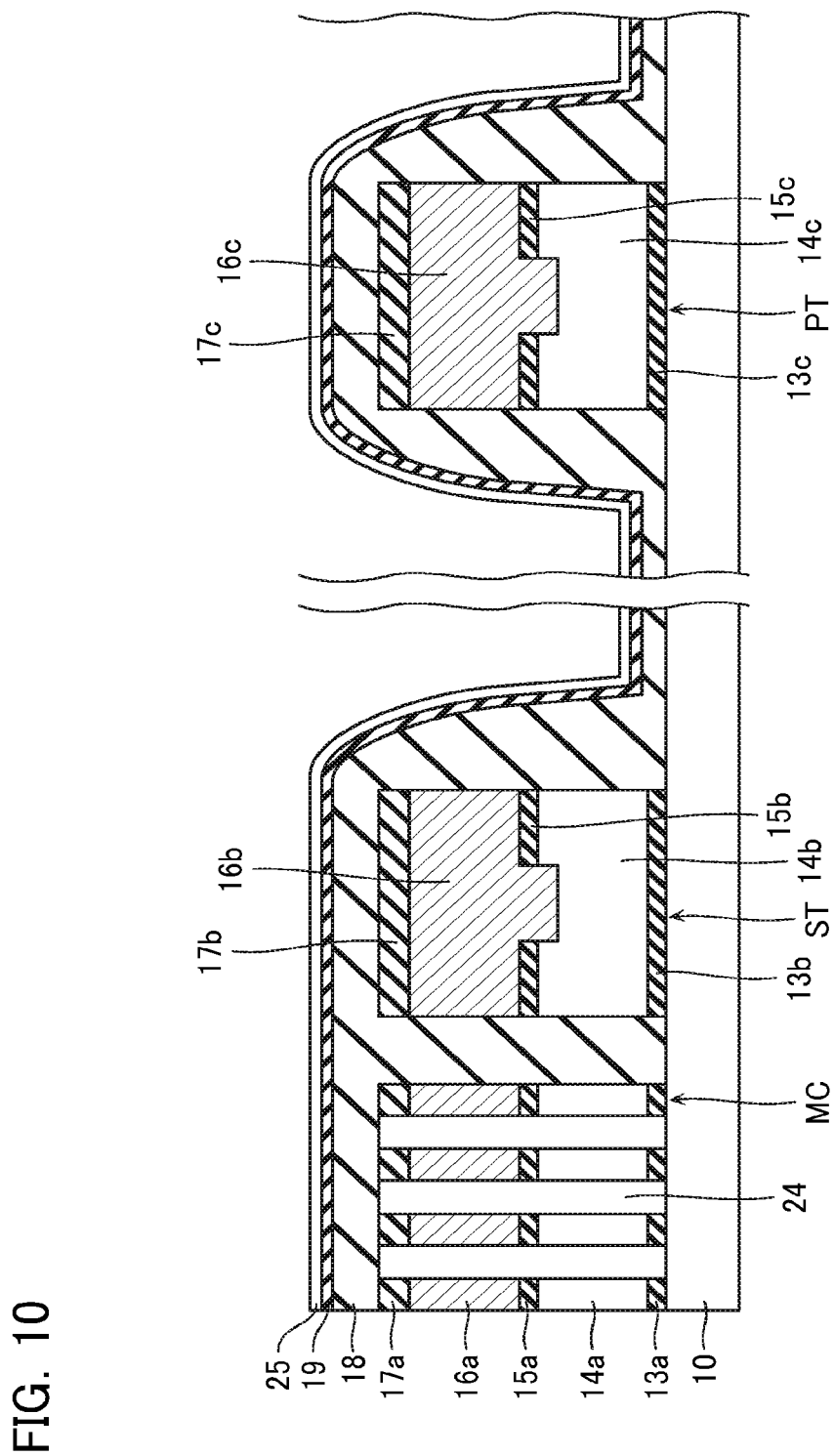
FIG. 10 is a process drawing showing a method of manufacturing the nonvolatile semiconductor memory device of the second embodiment.

As shown in FIG. 10, amorphous silicon is deposited on the surface of the first silicon nitride layer 19 by the likes of a CVD method, and the amorphous silicon layer 25 is obtained.

Contrary to in the first embodiment, in the case of depositing the amorphous silicon layer 25, there is no need to heat-treatment oxidize the surface of the first silicon nitride layer 19. However, heat-treatment oxidation may be performed from the viewpoint of expelling impurities such as hydrogen included in the first silicon nitride layer 19. Moreover, in this case, a silicon oxide layer gets further formed between the first silicon nitride layer 19 and the amorphous silicon layer, and characteristics of blocking impurities such as hydrogen further improve.

Figure 11:
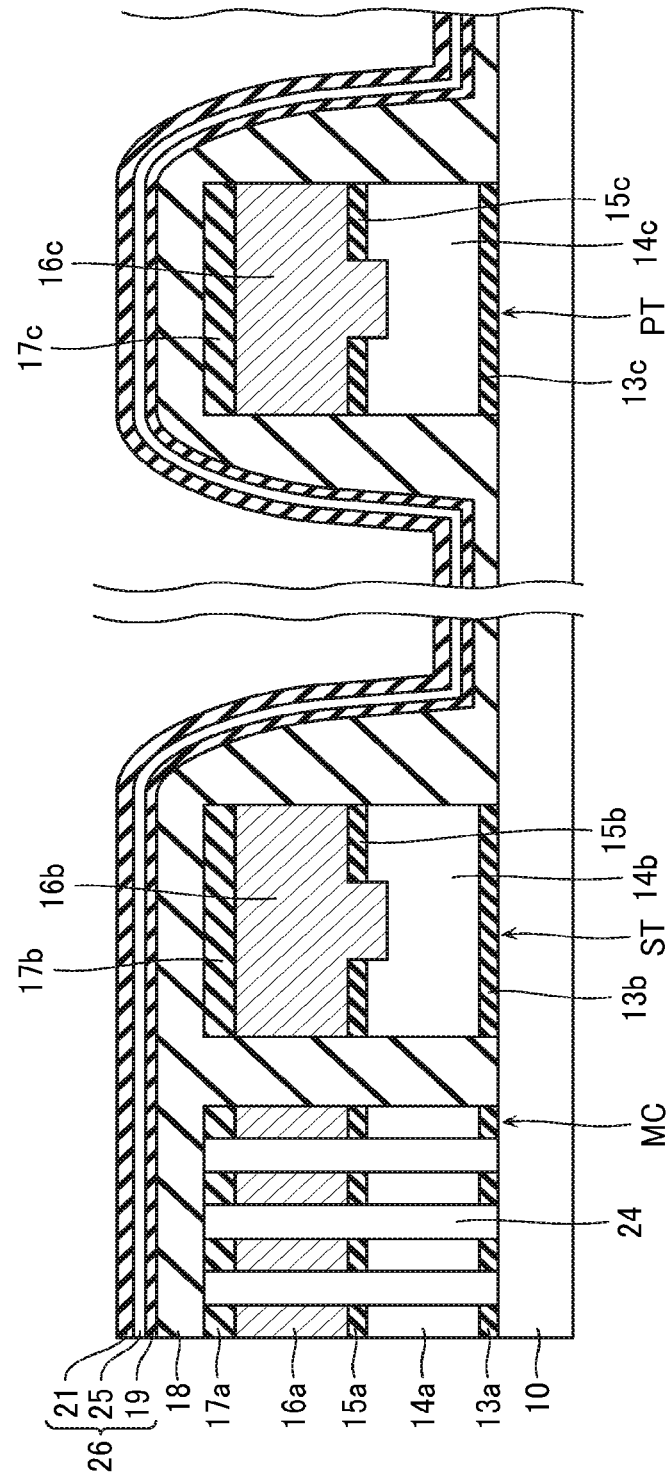
FIG. 11 is a process drawing showing the method of manufacturing the nonvolatile semiconductor memory device of the second embodiment.

As shown in FIG. 11, the second silicon nitride layer 21 is deposited on a surface of the amorphous silicon layer 25. A method of depositing or thickness of the layer are similar to in the first embodiment. In such a way, the cover layer 26 configured from a three-layer structure of the first silicon nitride layer 19, the amorphous silicon layer 25, and the second silicon nitride layer 21, is obtained.

Then, the second inter-layer insulating layer 23 configured from the likes of silicon oxide is deposited on an upper portion of the cover layer 26, and the likes of photolithography or etching are employed to form the contacts $C_p$ and $C_{st}$ and the spacer $S_p$, whereby a configuration shown in FIG. 9 is obtained.

Third Embodiment

A nonvolatile semiconductor memory device according to a third embodiment will be described using FIG. 12.

Figure 12:
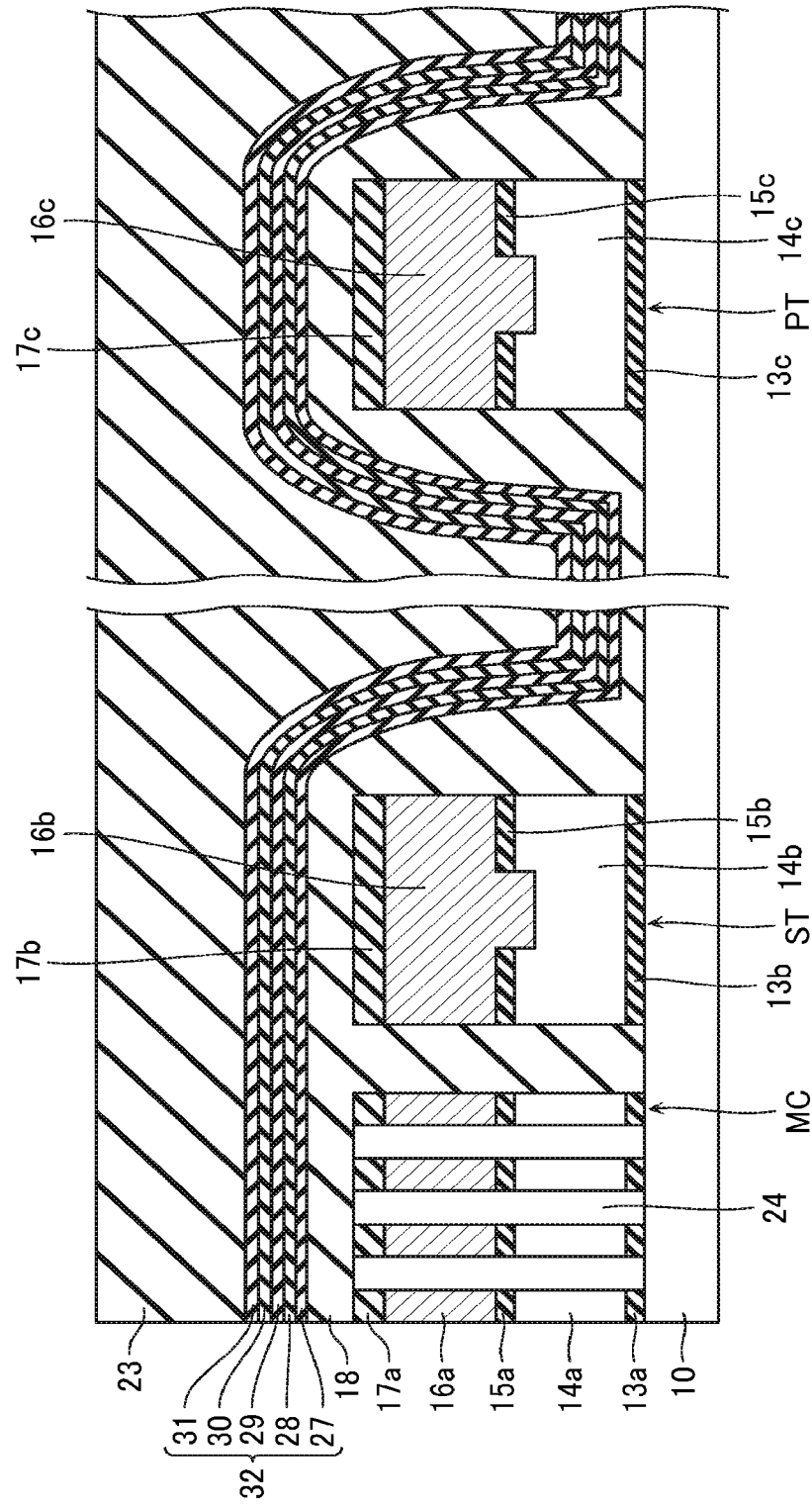
FIG. 12 is a partial cross-sectional view showing an example of a configuration of a nonvolatile semiconductor memory device of a third embodiment.

As shown in FIG. 12, the nonvolatile semiconductor memory device according to the third embodiment has a stacked structure of its cover layer that differs from those of the nonvolatile semiconductor memory devices according to the first and second embodiments.

In the nonvolatile semiconductor memory device according to the third embodiment, a configuration of a cover layer 32 has a five-layer structure in which a first silicon nitride layer 27, a first silicon oxide layer 28, a second silicon nitride layer 29, a second silicon oxide layer 30, and a third silicon nitride layer 31 are stacked in this order from a memory cell MC side.

This cover layer 32 has an overall thickness substantially identical to those of the cover layer 22 of the first embodiment and the cover layer 26 in the second embodiment. Moreover, the first silicon oxide layer 28 and the second silicon oxide layer 30 are formed by respectively plasma oxidizing surfaces of the first silicon nitride layer 27 and the second silicon nitride layer 29 at about 800° C. to 900° C. In other words, it is possible to adopt a configuration where a thickness of the silicon nitride layer overall further decreases and a thickness of the silicon oxide layer has further increased compared to in the first and second embodiments.

Hence, emission of hydrogen from the silicon nitride layer and penetration into the memory cell of impurities can be further suppressed compared to in the first embodiment.

The first silicon oxide layer 28 and the second silicon oxide layer 30 may each be configured as an amorphous silicon layer.

Comparative Example

Finally, a nonvolatile semiconductor memory device according to a comparative example will be described using FIGS. 13 to 16.

Figure 13:
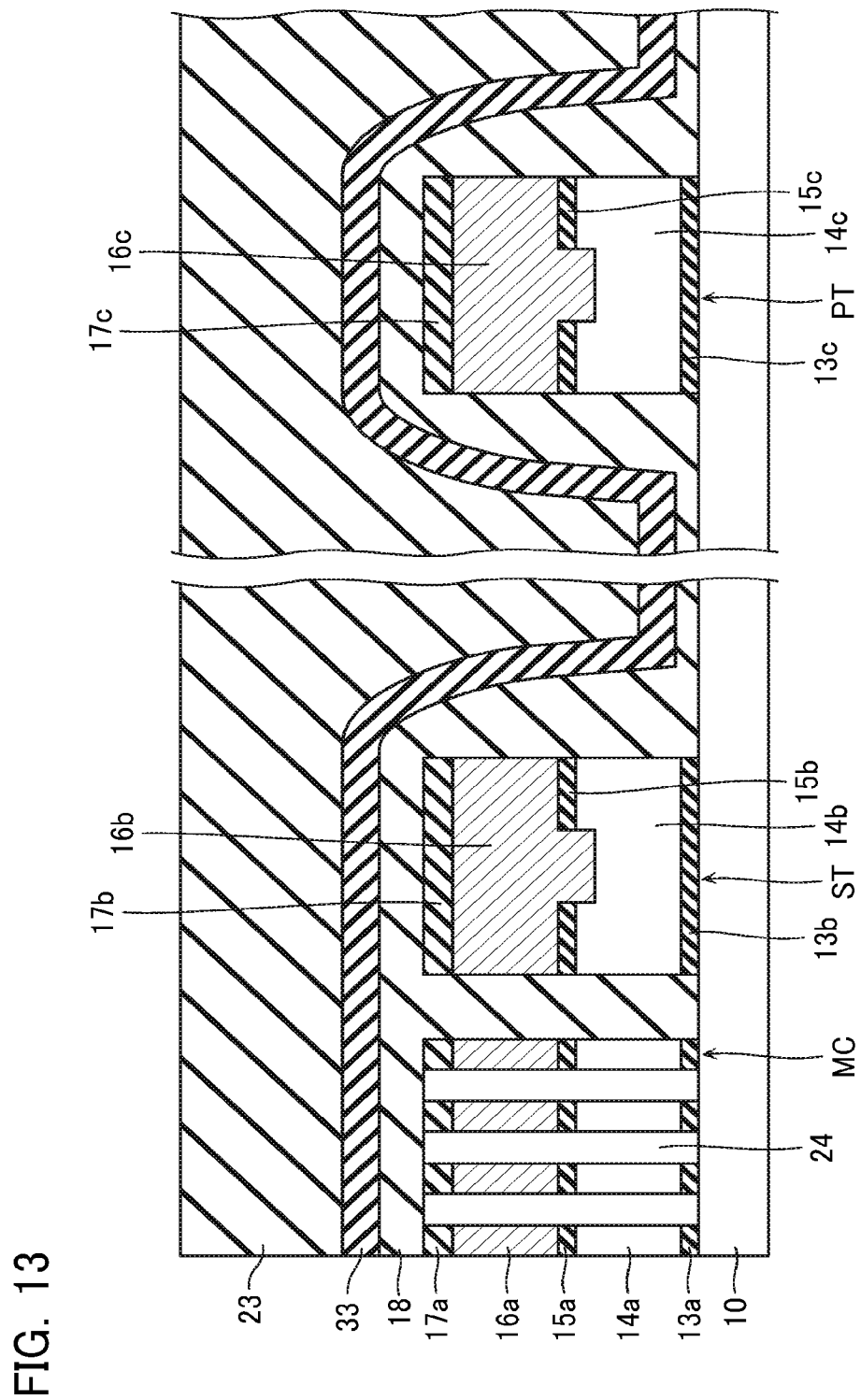
FIG. 13 is a partial cross-sectional view showing an example of a configuration of a nonvolatile semiconductor memory device according to a comparative example.

As shown in FIG. 13, in the nonvolatile semiconductor memory device according to the comparative example, the memory cell MC, the select transistor ST, and the peripheral transistor PT are covered by a single-layer silicon nitride layer 33.

Figure 14:
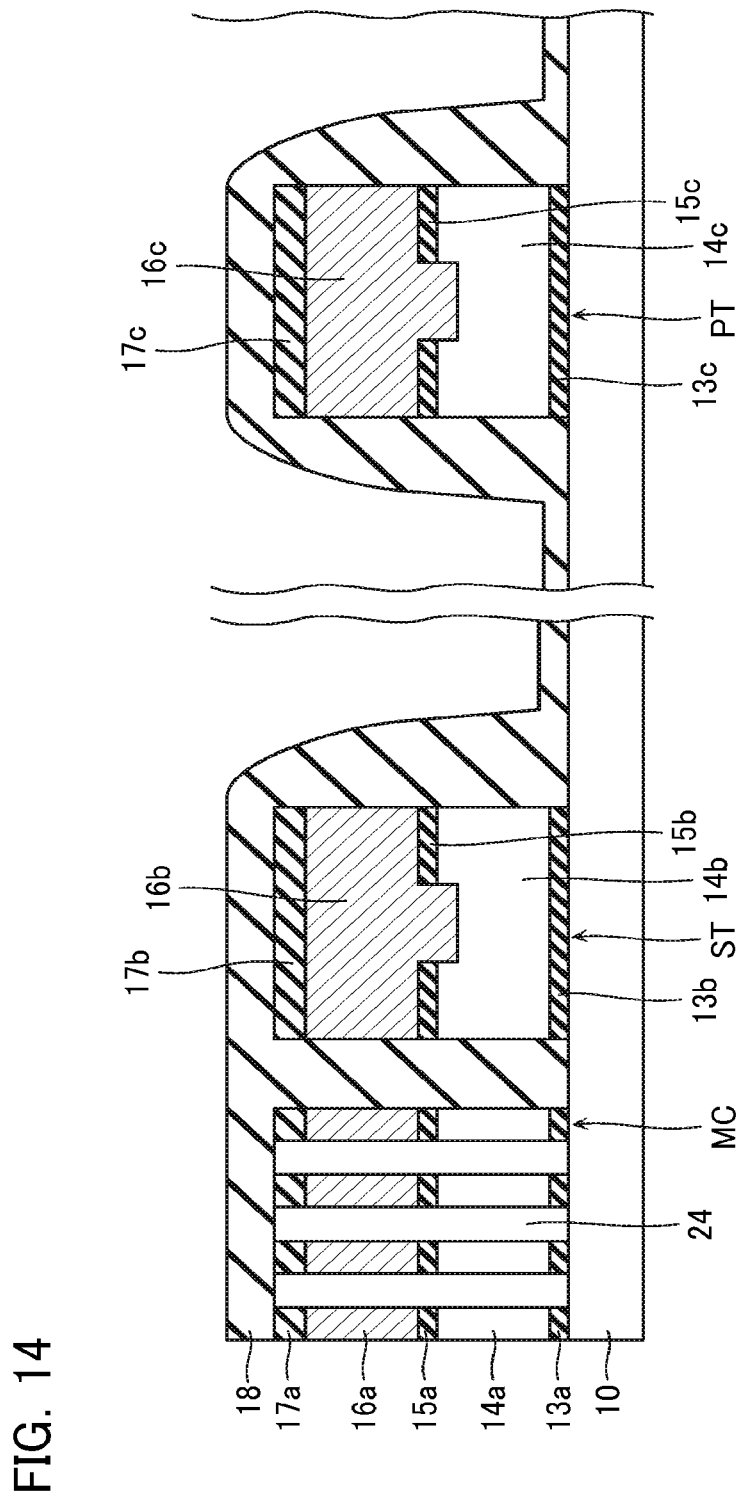
FIG. 14 is a process drawing showing a method of manufacturing the nonvolatile semiconductor memory device according to the comparative example.

In order to manufacture the nonvolatile semiconductor memory device according to the comparative example, first, as shown in FIG. 14, the memory cell MC, the select transistor ST, the peripheral transistor PT, and so on, are formed on the substrate 10, and the first inter-layer insulating layer 18 configured from silicon oxide is deposited.

Figure 15:
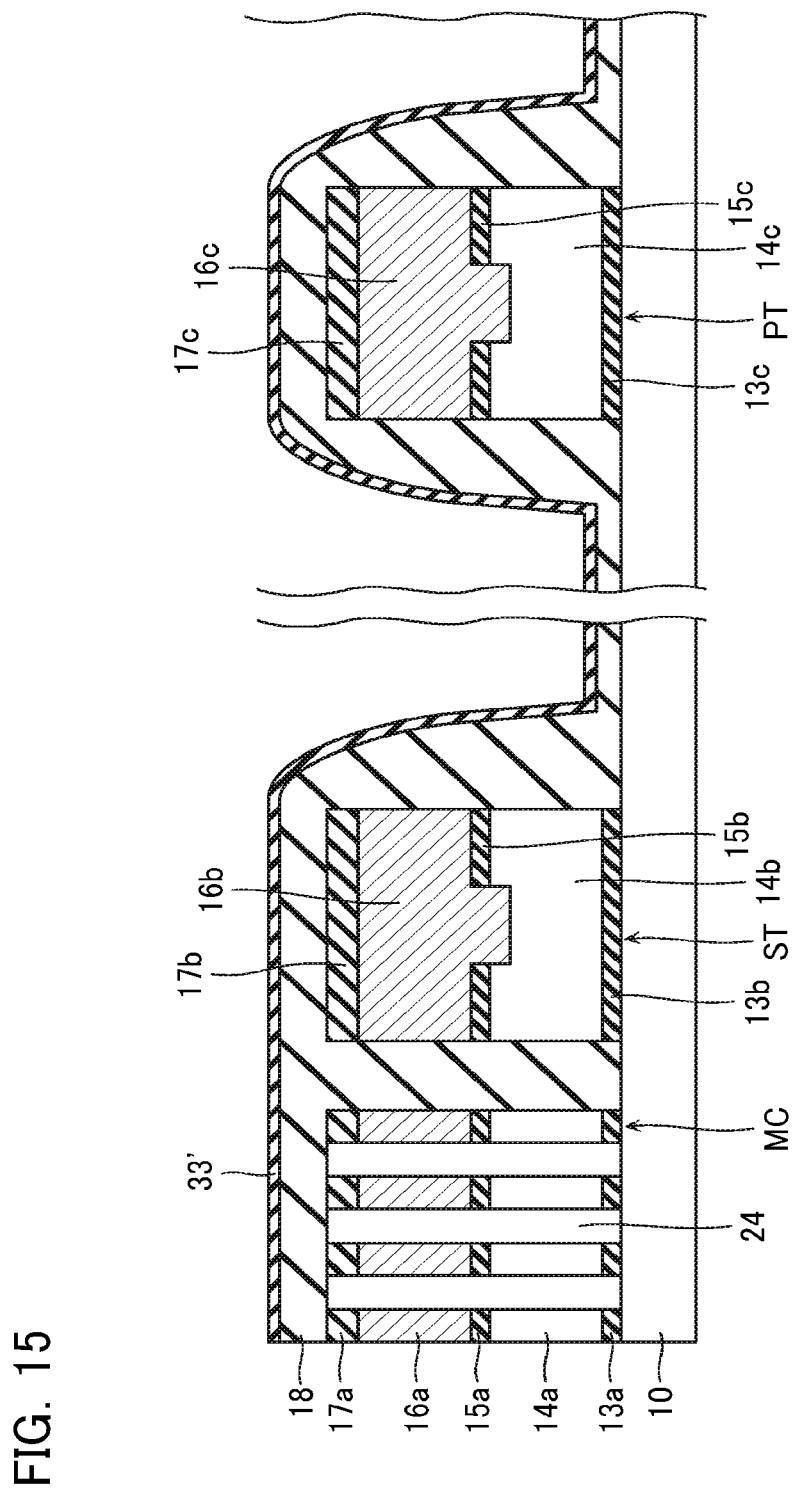
FIG. 15 is a process drawing showing the method of manufacturing the nonvolatile semiconductor memory device according to the comparative example.

As shown in FIG. 15, a first silicon nitride layer 33' is deposited. Up to this step is similar to the above embodiments.

Figure 16:
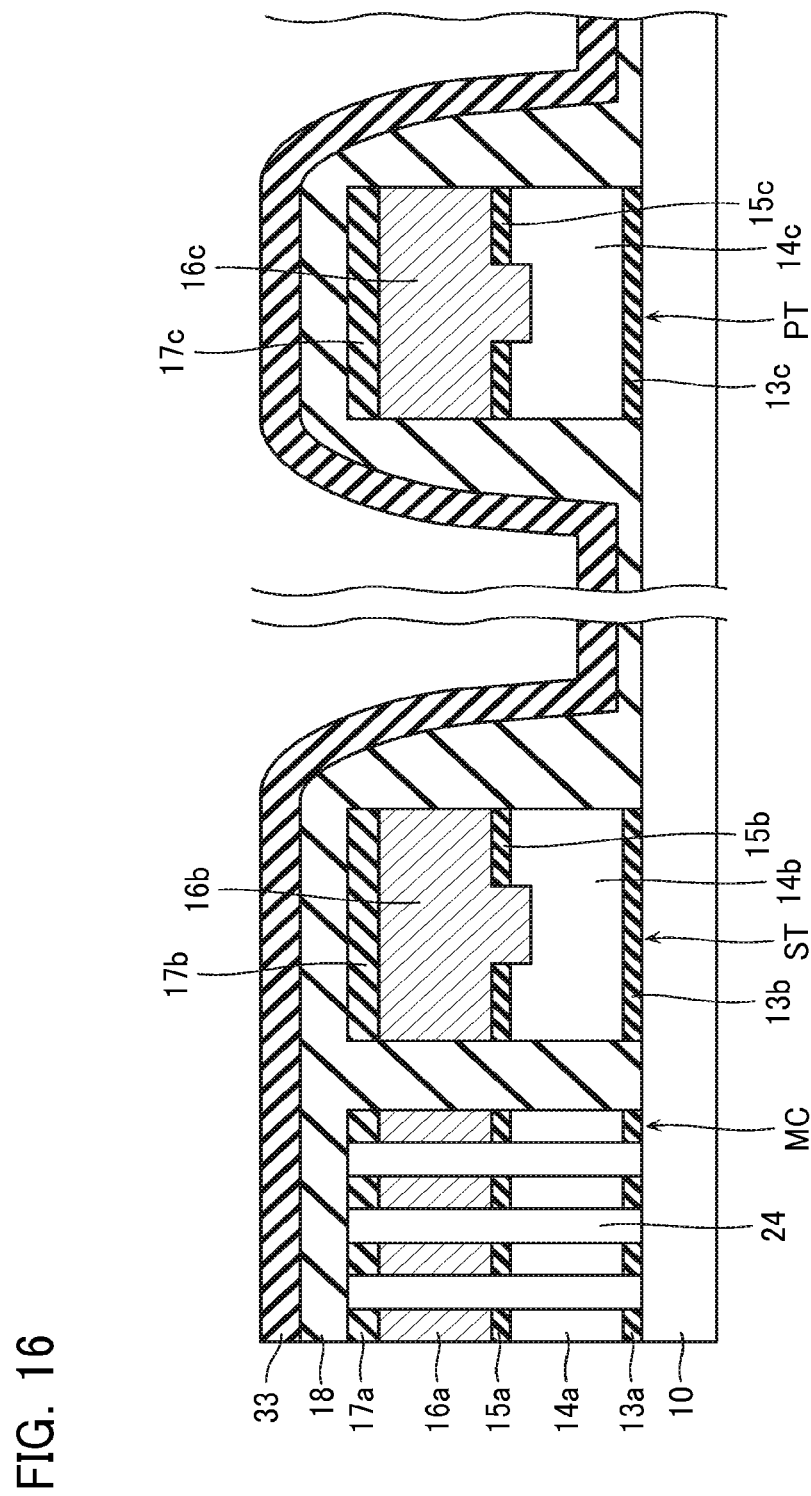
FIG. 16 is a process drawing showing the method of manufacturing the nonvolatile semiconductor memory device according to the comparative example.

Then, after an unillustrated diffusion layer has been formed by implantation of an impurity, a silicon nitride layer is further deposited and the silicon nitride layer 33 is obtained as shown in FIG. 16.

In the nonvolatile semiconductor memory device according to the comparative example, a silicon oxide layer present in the silicon nitride layer 33 is only a natural silicon oxide layer formed by having contacted outside air, as described using FIG. 8.

The silicon oxide layer formed by natural oxidation is extremely thin and cannot sufficiently block hydrogen emitted from the silicon nitride layer or a layer above it. Moreover, the silicon nitride layer is not heat-treated, hence hydrogen included in the silicon nitride layer remains in a large amount and configures electron traps, whereby there is a significantly increased possibility of cell characteristics being degraded.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A nonvolatile semiconductor memory device, comprising:
   a substrate;
   a memory cell disposed within a memory cell region on the substrate, the memory cell accumulating a charge as data; and
   a cover layer covering the memory cell, the cover layer having a structure in which a first silicon nitride layer, an intermediate layer, and a second silicon nitride layer are stacked sequentially from a side of the memory cell, the intermediate layer being amorphous silicon; wherein
   the memory cell comprises: a gate insulating film disposed on the substrate; a floating gate electrode disposed on the gate insulating film; a block insulating film disposed above the floating gate electrode; and a control gate electrode disposed on the block insulating film;
   a select transistor is disposed in a periphery of the memory cell within a memory cell region;
   a peripheral transistor is disposed within a peripheral region, the peripheral region being in a periphery of the memory cell array region; and a contact is disposed in a periphery of said peripheral transistor;

the cover layer covers an upper portion of the peripheral transistor and has an end of the cover layer contacting the contact;

a spacer configured from an insulator is disposed on the upper portion of the peripheral transistor;

the cover layer is disposed curved toward a substrate surface direction in the portion shifting from the memory cell array region to the peripheral region, so as to cover upper portions of the memory cell and the select transistor and face part of a side surface of the select transistor; and the cover layer is divided by the spacer.

2. The nonvolatile semiconductor memory device according to claim 1, wherein the intermediate layer is silicon oxide.

3. The nonvolatile semiconductor memory device according to claim 1, wherein the second silicon nitride layer is thicker than the first silicon nitride layer.

4. The nonvolatile semiconductor memory device according to claim 1, wherein the cover layer further comprises: a second intermediate layer disposed on an upper surface of the second silicon nitride layer; and a third silicon nitride layer disposed on an upper surface of said second intermediate layer.

5. The nonvolatile semiconductor memory device according to claim 1, wherein an inter-layer insulating layer configured from silicon oxide is interposed between the memory cell and the cover layer.

* * * * *